United States Patent
Carinci et al.

(10) Patent No.: US 11,226,388 B2
(45) Date of Patent: Jan. 18, 2022

(54) IMAGE QUALITY IN SPIN ECHO BASED IMAGING WITH PARALLEL IMAGING

(71) Applicant: Siemens Healthcare GmbH, Erlangen (DE)

(72) Inventors: Flavio Carinci, Wuerenlingen (CH); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/713,412

(22) Filed: Dec. 13, 2019

(65) Prior Publication Data

US 2020/0191894 A1 Jun. 18, 2020

(30) Foreign Application Priority Data

Dec. 13, 2018 (EP) .................................... 18212453

(51) Int. Cl.
  *G01R 33/561* (2006.01)

(52) U.S. Cl.
  CPC ..... *G01R 33/5612* (2013.01); *G01R 33/5617* (2013.01)

(58) Field of Classification Search
  CPC .......................... G01R 33/5612; G01R 33/5617
  See application file for complete search history.

(56) References Cited

U.S. PATENT DOCUMENTS

| 2016/0003928 | A1* | 1/2016 | Chen | G01R 33/4822 324/309 |
| 2016/0109546 | A1* | 4/2016 | Machii | G01R 33/56554 324/322 |
| 2016/0238685 | A1 | 8/2016 | Neji et al. | |
| 2017/0322280 | A1 | 11/2017 | Carinci et al. | |
| 2018/0143277 | A1* | 5/2018 | Chen | G01R 33/5611 |
| 2018/0224513 | A1 | 8/2018 | Zeller | |

OTHER PUBLICATIONS

Deshpande, V. S. et al. "Technical advances for breast diffusion MR imaging on wide-bore 3T systems" Proceedings of the International Societyfor Magnetic Resonance in Medicine, ISMRM, 19th Annual Meeting and Exhibition, Abstract No. 3076, May 7-13, 2011.
European Search Report dated Jun. 18, 2019, for Application No. 18212453.7.

* cited by examiner

*Primary Examiner* — Gregory H Curran
(74) *Attorney, Agent, or Firm* — Schiff Hardin LLP

(57) ABSTRACT

In a method for detecting MR signals of an object in an MR scanner, in which the MR signals of the object are detected with receiving channels at the same time using a parallel imaging technique, where the MR signals are spin-echoes generated with a spin-echo based imaging sequence, a first magnetic field gradient (MFG) is applied in a slice selection direction (SSD) while applying an RF excitation pulse of the spin echo based imaging sequence, the first MFG having a first polarity during the application of the RF excitation pulse, a second MFG is applied in the SSD while applying at least a first RF refocusing pulse of the spin echo based imaging sequence, the second magnetic field gradient has a second polarity opposite to the first polarity, and the MR signals of the spin echo are detected to generate an MR image based on the detected MR signals.

8 Claims, 3 Drawing Sheets

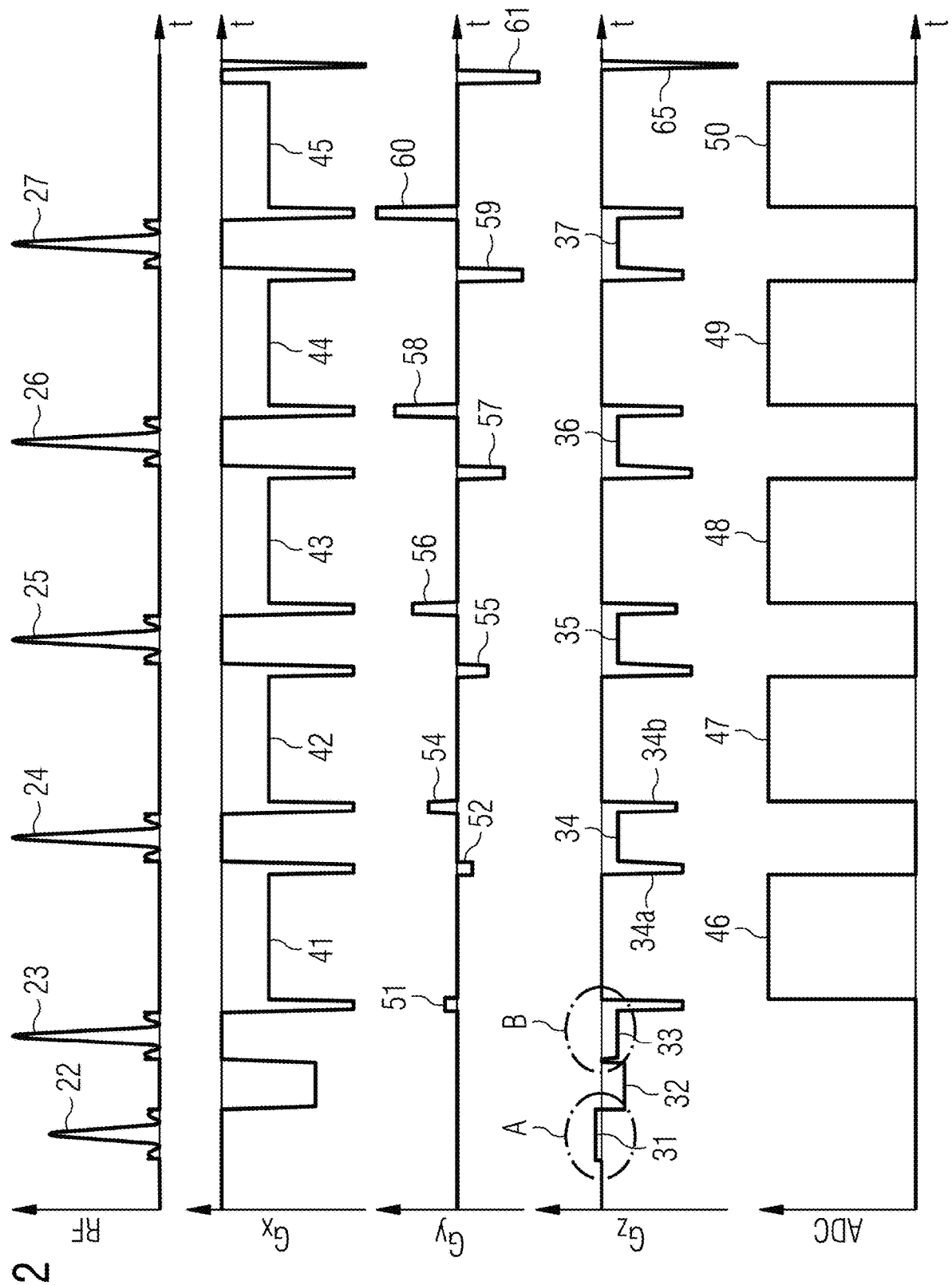

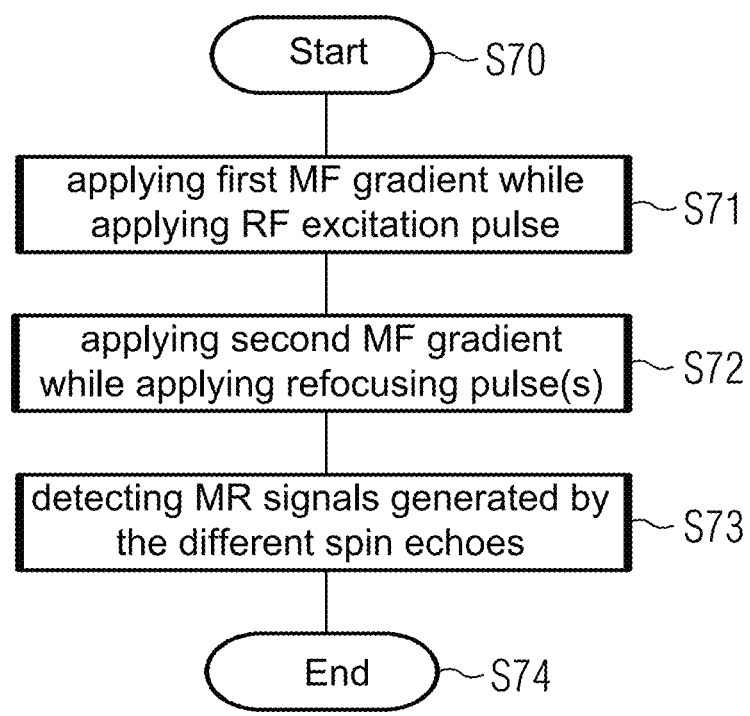

IMAGE QUALITY IN SPIN ECHO BASED IMAGING WITH PARALLEL IMAGING

CROSS REFERENCE TO RELATED APPLICATIONS

This patent application claims priority to European Patent Application No. 18212453.7, filed Dec. 13, 2018, which is incorporated herein by reference in its entirety.

BACKGROUND

Field

The disclosure relates to a method for detecting MR signals in an object under examination, to the corresponding MR system configured to detect the MR signals of the object and to a computer program including program code and to an electronically readable data carrier.

Related Art

MR imaging systems suffer from reduced magnet and magnetic field homogeneity at the edges of the bore. Depending on the relative lengths of the main magnet and of the gradient coil generating the magnetic field gradients, these inhomogeneities can lead to areas with high signal intensity in peripheral regions of the bore, which are also called 3rd arm artifacts.

Especially MR imaging systems with a relatively short bore have a reduced magnetic field homogeneity and a reduced gradient field accuracy at the edges of the bore. This represents the root cause for the high signal intensity artifacts.

Furthermore, MR imaging sequences which use parallel imaging techniques such as GRAPPA or simultaneous multislice (SMS) are often prone to aliasing artifacts which appear at a position FOV/R in the phase encoding direction with R being the acceleration factor and FOV being the field of view. For simultaneous multislice (SMS) imaging sequences, also the slice acceleration and the so called FOV-shift factors play a role in defining the position of the aliasing artifacts. The combination of residual aliasing induced by parallel imaging and the high signal intensity artifacts, due to the inhomogeneities at the edges of the bore, can lead to localized artifacts within the region of interest of the image. These could be misinterpreted by the person analyzing the image. One reason for these artifacts is that the coil sensitivity information which is required for the parallel imaging technique is not correctly reflected by the reference scan in those highly inhomogeneous regions which contain both very high and very low signal intensities. This leads to the incomplete suppression of the aliasing artifacts which arise from the peripheral regions of the FOV, where the 3rd arm artifacts are generated.

This problem becomes apparent especially for spin echo based imaging sequences. Furthermore, it was found that these artifacts are particularly relevant for spine imaging when the simultaneous multislice technique is used.

One option to overcome the above described problems would be to either deactivate the parallel acquisition techniques or to utilize averaging techniques. A major disadvantage of the averaging technique is that it does not allow any reduction in scan time compared to a non-accelerated imaging.

Another option would be to use an external reference scan as disclosed in US 2018/0224513 A1. This, however, does not always solve the problem completely.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 2 illustrates a schematic view of a sequence diagram, according to an exemplary embodiment, that can be used to generate the MR images with the reduced high signal intensity artifact.

FIG. 3 illustrates a flow chart of a method, according to an exemplary embodiment, which can be carried out by the MR imaging system of FIG. 1 in order to generate MR images with the reduced high signal intensity artifact.

Figure 1:
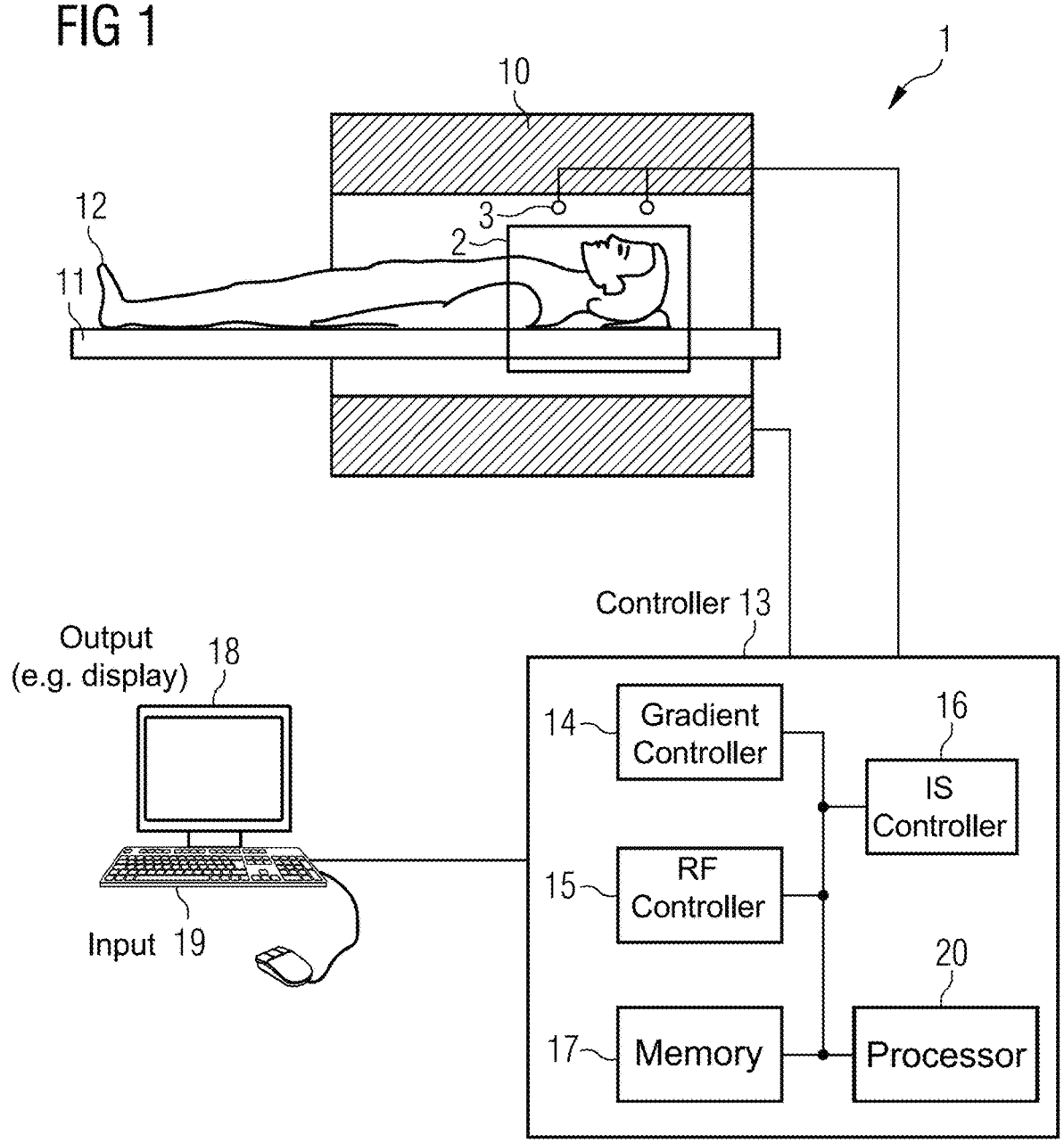
FIG. 1 illustrates a schematic view of an MR system, according to an exemplary embodiment, configured to generate MR images based on spin echo based imaging sequences with a parallel imaging technique in which the high signal intensity artifacts occurring at the edges of the bore are reduced.

The exemplary embodiments of the present disclosure will be described with reference to the accompanying drawings. Elements, features and components that are identical, functionally identical and have the same effect are—insofar as is not stated otherwise—respectively provided with the same reference character.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide a method and an MR imaging system with reduced image artifacts intensity the 3rd arm artifacts, without increasing the total scan time.

According to a first aspect, a method for detecting MR signals of an object under examination in an MR imaging system is provided in which MR signals of the object are detected with a plurality of receiving channels at the same time using a parallel imaging technique. Furthermore, the MR signals are spin echoes generated with a spin echo based imaging sequence. According to one step of the method a first magnetic field gradient is applied in a slice selection direction while applying an RF excitation pulse of the spin echo based imaging sequence. This first magnetic field gradient has a first polarity during the application of the RF excitation pulse. Furthermore, a second magnetic field gradient is applied in the slice selection direction while applying at least a first RF refocusing pulse of the spin echo based imaging sequence. The second magnetic field gradient has a second polarity opposite to the first polarity. MR signals of the at least one spin echo are detected in order to generate an MR image based on the detected MR signals.

According to this disclosure, magnetic field gradients of different polarity are used for the RF excitation pulse and the RF refocusing pulse(s). This means that a gradient reversal is applied with a different gradient polarity for the slice selection gradient of the excitation pulse and for the slice selection gradient of the at least one refocusing pulse. With this solution, the above mentioned magnetic field inhomogeneities which are present during slice excitation and during signal refocusing are different from each other so that the artifacts are eliminated or at least reduced.

This spin echo based imaging sequence can be a multi echo sequence including a plurality of refocusing pulses after a single RF excitation pulse. The second magnetic field gradient is then applied with the second polarity opposite the first polarity for each of the refocusing pulses. This means that each of the magnetic field gradients applied during the refocusing pulses has the same polarity and a polarity opposite to the polarity of the magnetic field gradient applied during the application of the RF excitation pulse.

Furthermore, the method can be applied with simultaneous multislice meaning that multiple slices of the object under examination are excited with the RF excitation pulse and the at least one RF refocusing pulse simultaneously.

Furthermore, it is possible that the detected MR signals are used to generate a weighting matrix used in the parallel imaging technique to reconstruct the missing k-space data that are not acquired during the spin echo based imaging sequence from the acquired k-space data which are obtained from the detected MR signals. The weighting matrix can be generated with a reference scan. As described in US 2018/0224513 A1, the weighting matrix can also be determined such that the part of the image space providing high signal parts due to the inhomogeneity are less weighted for the generation of the missing k-space data.

Furthermore, an MR imaging system is provided and configured to detect the MR signals of the object under examination wherein the MR imaging system includes a plurality of receiving coils which are configured to detect the MR signals of the object under examination at the same time using a parallel imaging technique. Furthermore, a controller is provided and configured to control the application of RF pulses and the magnetic field gradients of this spin echo based imaging sequence as discussed above or as discussed in further detail below.

Furthermore, a computer program including program code to be executed by the controller of the MR imaging system is provided wherein execution of the program code causes the at least one controller to execute a method as mentioned above.

Furthermore a carrier including the computer program is provided wherein the carrier is one of an electronic signal, optical signal, radio signal, or a computer readable storage medium.

It should be understood, that the features mentioned above and features yet to be explained below can be used not only in the respective combinations indicated, but also in other combinations or in isolation without departing from the scope of the present disclosure. Features of the above-mentioned aspects and embodiments described below may be combined with each other in other embodiments unless explicitly mentioned otherwise.

FIG. 1 shows a schematic view of an MR system 1 according to an exemplary embodiment. The MR system 1 can include a magnet 10 configured to generate a polarization field B0. An object under examination 12 lying on a table 11 is moved into the center of the MR system 1 where MR signals after RF excitation can be detected by a receiving coil 2, which can include different coil sections wherein each coil section is associated with a corresponding detection channel. By applying RF pulses and magnetic field gradients, the nuclear spins in the object 12, especially in the part located in the receiving coil 2 are excited and the currents induced by the relaxation are detected. The way how MR images are generated and how the MR signals are detected using a sequence of RF pulses and a sequence of magnetic field gradients are known in the art so that a detailed explanation thereof is omitted.

The MR system includes a controller 13 which is used for controlling the MR system. The controller 13 includes a gradient controller 14 for controlling and switching the magnetic field gradients, an RF controller 15 for controlling and generating the RF pulses for the imaging sequences. An image sequence (IS) controller 16 is provided which controls the sequence of the applied RF pulses and magnetic field gradients and thus controls the gradient controller 14 and the RF controller 15. In a memory 17, computer programs needed for operating the MR system and the imaging sequences necessary for generating the MR images can be stored together with the generated MR images. The generated MR images can be displayed on a display 18 wherein input unit 19 is provided used by a user of the MR system to control the functioning of the MR system. A processor 20 can coordinate the operation of the different functional units shown in FIG. 1 and can include one or more processors which can carry out instructions stored on the memory 17. The memory includes the program code to be executed by the processor 20. In an exemplary embodiment, the controller 13 (or one or more components therein) includes processor circuitry that is configured to perform one or more respective functions and/or operations of the controller 13 (or the respective component(s)).

In an exemplary embodiment, the processor 20, the controller 13 and/or the image sequence controller 16 is/are configured such that the high intensity artifacts occurring due to field inhomogeneity in parallel imaging techniques are reduced as will be explained below.

FIG. 2 shows a spin echo based imaging sequence which can be used in the system shown in FIG. 1 in order to reduce these 3rd arm artifacts. The imaging sequence shows the applied RF pulses, the gradient switching and the data acquisition over time. As shown, an RF excitation pulse 22 is applied followed by several RF refocusing pulses 23 to 27. In the example shown five refocusing pulses are used. However, it should be understood, that any number of refocusing pulses might be used. As far as the gradient nomenclature is concerned the gradient in the Z-direction is the slice selection gradient, the gradient in the X-direction is the readout gradient and the gradient in the Y-direction is the phase encoding gradient. In the slice encoding direction a first magnetic field gradient 31 having a first polarity is applied during the excitation of the spins with the excitation pulse 22. The first magnetic field gradient 31 is followed by a refocusing field gradient 32 as known in the art. During the application of the refocusing pulse 23, a further magnetic field gradient is applied in the slice encoding direction, namely the magnetic field gradient 33. The gradient, 31 and 33 are highlighted by circle A and circle B, respectively. As can be deduced from the comparison of the two areas A and B, different polarities of the slice selection gradient are used for the excitation pulse compared to the refocusing pulse 23. For the refocusing pulses 24 to 27 magnetic field gradients in the slice encoding direction having the same polarity as for the first refocusing pulse 23 are applied, namely the gradients 35 to 37. The RF pulses are applied during the constant plateau of the gradients 34 to 37. Before and after the plateau part crushing gradients 34A and 34B are applied in order to destroy an FID, full induction decay, signal part that is generated by the combination of the excitation pulse 22 and the refocusing pulse 23. Furthermore, it can be seen from the slice selection gradient the components 34A and 34B are of different height as blips are used in view of the simultaneous multislice imaging technology used in FIG. 2. If SMS is not used the components 34A and 34B may have the same height (or the same momentum).

The gradient switching in the read-out direction corresponds to a common multi-spin echo imaging sequence so that gradients 41, 42, 43, 44 and 45 are switched on during the corresponding data acquisition segments 46 to 50. As far as the phase encoding direction is concerned the phase encoding gradients 51 to 61 are used in order to cover the k-space in the phase encoding direction with different gradient strengths (or gradient moments). Finally, a spoiling gradient 65 is applied in the slice selection direction used to dephase any remaining magnetization before the next RF excitation pulse is used.

The imaging sequence shown in FIG. 2 may be used with a simultaneous multislice factor of 2. However, it might be also used without SMS.

As discussed above, the gradients in the slice selection direction for the RF excitation pulse has a first polarity, wherein the polarity of the slice selection gradient applied during the refocusing pulses is opposite to the polarity used for the switching during the application of the excitation pulse.

FIG. 3 is a flowchart of a method according to an exemplary embodiment, where the method can be carried out by the MR imaging system shown in FIG. 1. In an exemplary embodiment, the method generates MR images based on the imaging sequence as shown in FIG. 2. In an exemplary embodiment, the method starts in step S70 and in step is S71 the first magnetic field gradient is applied in this slice selection direction while the RF excitation pulse 22 is applied to the object. As shown in FIG. 2, the magnetic field gradient 31 having a first polarity is used during the application of the RF excitation pulse 22. In the second step S72 another magnetic field gradient is applied in the slice selection direction when the refocusing pulse 23 or several refocusing pulses are applied, wherein each time the other magnetic field gradient has a second polarity opposite to the first polarity. In step S73 the MR signals generated by the different spin echoes are detected and in a step not shown an image can be reconstructed using the MR signals as shown.

The MR image can be reconstructed using parallel imaging technology. The method ends in step S74.

As shown by FIGS. 2 and 3 the total measurement time is not affected by the proposed solution as an averaging is not necessary.

The imaging sequence shown in FIG. 2 and the steps shown in FIG. 3 can be used for the generation of the MR image itself, or might be used for the generation of a reference scan as it is used in order to generate a weighting matrix used in the parallel imaging technique as disclosed in US 2018/0224513 A1. This weighting matrix can be used for GRAPPA or SMS imaging sequences and the weights could benefit from the reduced artifacts in the reference data as discussed above.

Summarizing, with the use of the different gradient polarity for the slice selection gradient of the excitation pulse and the slice selection gradients of the refocusing pulse or the refocusing pulses of a spin echo based pulse sequence in combination with the parallel imaging technique a reduced 3rd arm imaging artifact is obtained and there is no need to set up protocols with multiple averages so that the scan time can be minimized.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for detecting MR signals of an object under examination in a magnetic resonance (MR) imaging system, in which the MR signals of the object under examination are detected with a plurality of receiving channels at a same time using a parallel imaging technique, where the MR signals are spin-echoes generated with a spin-echo based imaging sequence, the method comprising:
applying a first magnetic field gradient in a slice selection direction while applying a radio frequency (RF) excitation pulse of the spin-echo based imaging sequence, the first magnetic field gradient having a first polarity during the application of the RF excitation pulse;
applying a second magnetic field gradient in the slice selection direction while applying at least one RF refocusing pulse of the spin-echo based imaging sequence, the second magnetic field gradient having a second polarity opposite to the first polarity, wherein multiple slices of the object under examination are simultaneously excited with the RF excitation pulse and the at least one RF refocusing pulse;
detecting the MR signals of the at least one spin echo, wherein the detected MR signals are used to generate a weighting matrix used in the parallel imaging technique to reconstruct missing k-space data not acquired during the spin echo based imaging sequence from acquired k-space data acquired with the detected MR signals, to reduce 3rd arm artifacts; and
providing the detected MR signals in an electronic form in order to generate an MR image based on the detected MR signals.

2. The method according to claim 1, wherein the spin echo based imaging sequence is a multi-echo sequence including a plurality of refocusing pulses after one RF excitation pulse, wherein the second magnetic field gradient is applied with the second polarity opposite the first polarity while each of the plurality of refocusing pulses is applied.

3. A non-transitory computer-readable storage medium with an executable program stored thereon, that when executed, instructs a processor to perform the method of claim 1.

4. A computer program product having a computer program which is directly loadable into a memory of a controller of the magnetic resonance device, when executed by the controller, causes the magnetic resonance device to perform the method as claimed in claim 1.

5. A magnetic resonance (MR) imaging system configured to detect MR signals of an object under examination, the MR imaging system comprising:
a plurality of receiving channels configured to detect MR signals of the object under examination channels at a same time using a parallel imaging technique; and
a controller configured to control an application of radio frequency (RF) pulses and magnetic field gradients of a spin-echo based imaging sequence, the control of the application of the RF pulses and the magnetic field gradients including:
applying a first magnetic field gradient in a slice selection direction while applying an RF excitation pulse of the spin-echo based imaging sequence, the first magnetic field gradient having a first polarity during the application of the RF excitation pulse; and
applying a second magnetic field gradient in the slice selection direction while applying at least one RF refocusing pulse of the spin-echo based imaging sequence, the second magnetic field gradient having a second polarity opposite to the first polarity, wherein:
the controller is configured to simultaneously excite multiple slices of the object under examination with the RF excitation pulse and the at least one RF refocusing pulse;
the plurality of receiving channels are configured to detect the MR signals of the at least one spin echo in order to generate an MR image based on the detected MR signals; and
the controller is configured to use the detected MR signals to generate a weighting matrix used in the parallel imaging technique to reconstruct missing k-space data that are not acquired during the spin echo based imaging sequence from the acquired k-space data which are obtained from the detected MR signals, to reduce 3rd arm artifacts.

6. The MR system according to claim 5, wherein the controller is configured to use a multi-echo sequence as the spin-echo based imaging sequence which includes a plurality of refocusing pulses after one RF excitation pulse, and configured to apply the second magnetic field gradient with the second polarity opposite the first polarity for each of the plurality of refocusing pulses.

7. The method according to claim 1, wherein the 3rd arm artifacts include artifacts that occur in the imaging sequence at an edge of a bore.

8. The method according to claim 1, wherein the parallel imaging technique is simultaneous multislice (SMS).

* * * * *